(12) United States Patent
Maeda (10) Patent No.: US 11,244,863 B2
(45) Date of Patent: Feb. 8, 2022

(54) METHOD FOR MANUFACTURING SEMICONDUCTOR APPARATUS

(71) Applicant: Mitsubishi Electric Corporation, Tokyo (JP)

(72) Inventor: Kazuhiro Maeda, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 43 days.

(21) Appl. No.: 16/959,369

(22) PCT Filed: May 28, 2018

(86) PCT No.: PCT/JP2018/020353
§ 371 (c)(1),
(2) Date: Jun. 30, 2020

(87) PCT Pub. No.: WO2019/229802
PCT Pub. Date: Dec. 5, 2019

(65) Prior Publication Data
US 2021/0066128 A1    Mar. 4, 2021

(51) Int. Cl.
*H01L 21/78* (2006.01)
*H01L 21/768* (2006.01)
*H01L 21/28* (2006.01)

(52) U.S. Cl.
CPC ........ *H01L 21/78* (2013.01); *H01L 21/28114* (2013.01); *H01L 21/76805* (2013.01); *H01L 21/76895* (2013.01)

(58) Field of Classification Search
CPC ........... H01L 21/7682; H01L 21/28114; H01L 23/315; H01L 21/78; H01L 21/304;
(Continued)

(56) References Cited

U.S. PATENT DOCUMENTS

| 2013/0076458 A1 | 3/2013 | Katou et al. |
| 2016/0042994 A1 | 2/2016 | Maeda et al. |
| 2017/0244055 A1* | 8/2017 | Bangsaruntip .... H01L 21/02623 |

FOREIGN PATENT DOCUMENTS

| JP | 2004147220 A | 5/2004 |
| JP | 2015187750 A | 10/2015 |
| JP | 2016039319 A | 3/2016 |

OTHER PUBLICATIONS

International Search Report; Written Opinion; and Notification of Transmittal of the International Search Report and the Written Opinion of the International Searching Authority, or the Declaration issued in PCT/JP2018/020353; dated Jul. 3, 2018.

* cited by examiner

*Primary Examiner* — Thanhha S Pham
(74) *Attorney, Agent, or Firm* — Studebaker & Brackett PC (57) ABSTRACT

A resin membrane (8) covering a semiconductor device (5) and a dicing line (7) of a semiconductor substrate (1) is formed on a main surface of the semiconductor substrate (1). The resin membrane (8) around the first electrode (2) is removed and the resin membrane (8) on the second electrode (3,4) is removed to form a first contact hole (9) without removing the resin membrane (8) on the dicing line (7). A resin film (11) is applied to a top surface of the resin membrane (8) to form a hollow structure (12) around the first electrode (2). The resin film (11) is patterned to form a second contact hole (13) connected to the first contact hole (9) and a first opening (14) above the dicing line (7) simultaneously. After forming the first opening (14), the semiconductor substrate (1) is diced along the dicing line (7).

13 Claims, 9 Drawing Sheets

(58) Field of Classification Search
CPC .............. H01L 21/3043; H01L 21/568; H01L 21/76805; H01L 21/76807; H01L 21/76811; H01L 2221/1031
See application file for complete search history.

METHOD FOR MANUFACTURING SEMICONDUCTOR APPARATUS

FIELD

The present disclosure relates to a method for manufacturing a semiconductor apparatus.

BACKGROUND

In order to achieve high integration and miniaturization of semiconductor apparatuses, a multi-layer wiring structure in which resin membranes and metal wirings are repeatedly laminated is used. However, the resin membranes increase parasitic capacitance, which causes electric characteristics of the semiconductor apparatuses to deteriorate. In particular, in a semiconductor apparatus including a Y-shaped or T-shaped gate electrode, spaces under the overhangs of a gate electrode are filled with resin, and therefore the parasitic capacitance increases and the gain of high frequency characteristics deteriorates. In contrast, a method for forming a hollow structure around the gate electrode by patterning the resin membrane that covers a semiconductor apparatus, removing the resin membrane around the gate electrode, and applying a resin film to a top surface of the resin membrane is proposed (e.g., see PTL 1). With formation of the hollow structure, the characteristics are greatly improved compared to a case where the gate electrode is buried in the resin membrane.

CITATION LIST

Patent Literature

[PTL 1] JP 2016-39319 A

SUMMARY

Technical Problem

Conventionally, when a resin membrane is patterned, the resin membrane on a dicing line has also been removed. Therefore, the contact area between a resin film and a resin membrane is reduced, and therefore an adhesive force is weakened. Furthermore, the resin film is supported by a support film, and after the resin film is applied to the resin membrane, the support film needs to be removed from the resin film. However, since the adhesive force between the resin film and the support film is stronger than the adhesive force between the resin film and the resin membrane, when the support film is removed from the resin film, floating or peeling of the resin film has sometimes occurred. Furthermore, the applied resin film has sometimes embedded in a hollow part. As a result, there has been a problem that the product yield lowers.

An object of the present invention, which has been made to solve the above-described problem, is to provide a method for manufacturing a semiconductor apparatus capable of improving the product yield.

Solution to Problem

A method for manufacturing a semiconductor apparatus according to the present disclosure includes: forming a semiconductor device including first and second electrodes on a main surface of a semiconductor substrate; forming a resin membrane covering the semiconductor device and a dicing line of the semiconductor substrate on the main surface of the semiconductor substrate; removing the resin membrane around the firs electrode and removing the resin membrane on the second electrode to form a first contact hole without removing the resin membrane on the dicing line; applying a resin film covering above the first and second electrodes and separated from the first and second electrodes to a top surface of the resin membrane to form a hollow structure around the first electrode; patterning the resin film to form a second contact hole connected to the first contact hole and a first opening above the dicing line simultaneously; forming a wiring connected to the second electrode via the first and second contact holes; and after forming the first opening, dicing the semiconductor substrate along the dicing line.

Advantageous Effects of Invention

In the present disclosure, when the photosensitive resin membrane is patterned, the photosensitive resin membrane on the dicing line is not removed. For this reason, the contact area between the photosensitive resin film and the photosensitive resin membrane increases, and therefore the adhesive force improves and it is possible to prevent floating and peeling of the photosensitive resin film. Since the photosensitive resin film is firmly supported by the photosensitive resin membrane, embedding can also be prevented. As a result, the product yield can be improved.

DESCRIPTION OF EMBODIMENTS

A method for manufacturing a semiconductor apparatus according to the embodiments of the present disclosure will be described with reference to the drawings. The same components will be denoted by the same symbols, and the repeated description thereof may be omitted.

First Embodiment

Figure 1:
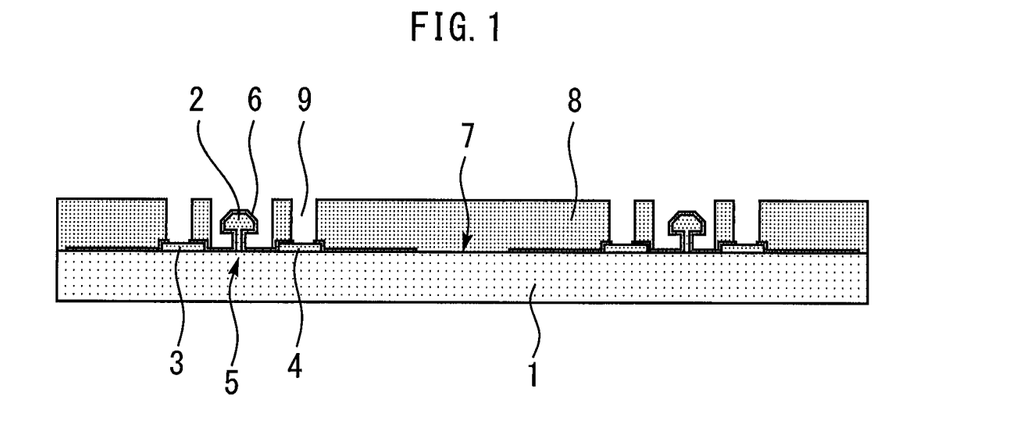
FIG. 1 is a cross-sectional view illustrating a method for manufacturing a semiconductor apparatus according to a first embodiment.

FIG. 1 to FIG. 9 are cross-sectional views illustrating a method for manufacturing a semiconductor apparatus according to a first embodiment. First, as shown in FIG. 1, a semiconductor device 5 including a gate electrode 2, a source electrode 3 and a drain electrode 4 is formed on a main surface of a semiconductor substrate 1. The semiconductor device 5 is covered with a high wet-proof insulating film 6. The insulating film 6 over the source electrode 3, the drain electrode 4 and a dicing line 7 are opened. Next, a photosensitive resin membrane 8 covering the semiconductor device 5 and the dicing line 7 of the semiconductor substrate 1 is applied to the main surface of the semiconductor substrate 1 using a spin coater. The photosensitive resin membrane 8 is patterned by exposure and development, the photosensitive resin membrane 8 around the gate electrode 2 is removed without removing the photosensitive resin membrane 8 on the dicing line 7, the photosensitive resin membrane 8 on the source electrode 3 and the drain electrode 4 is removed to form a first contact hole 9. After that, thermosetting treatment is performed to cure the photosensitive resin membrane 8.

Figure 2:
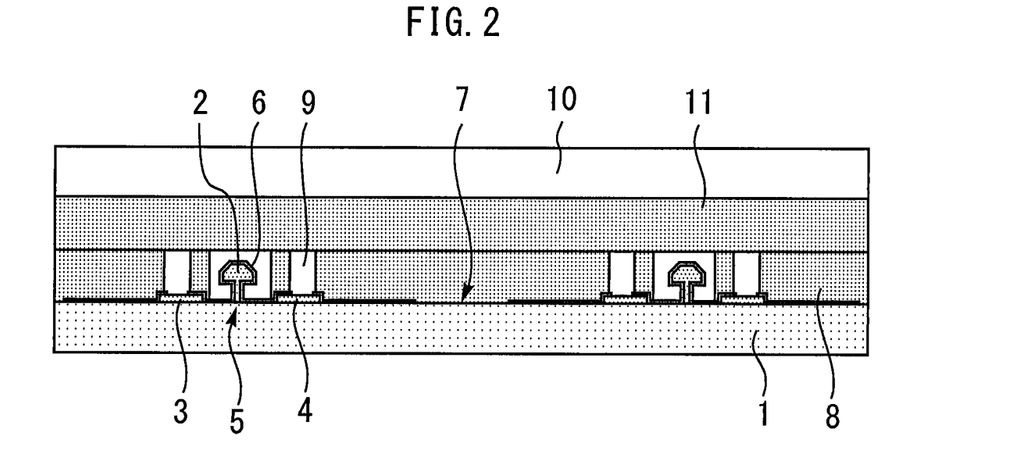
FIG. 2 is a cross-sectional view illustrating a method for manufacturing a semiconductor apparatus according to a first embodiment.
Figure 3:
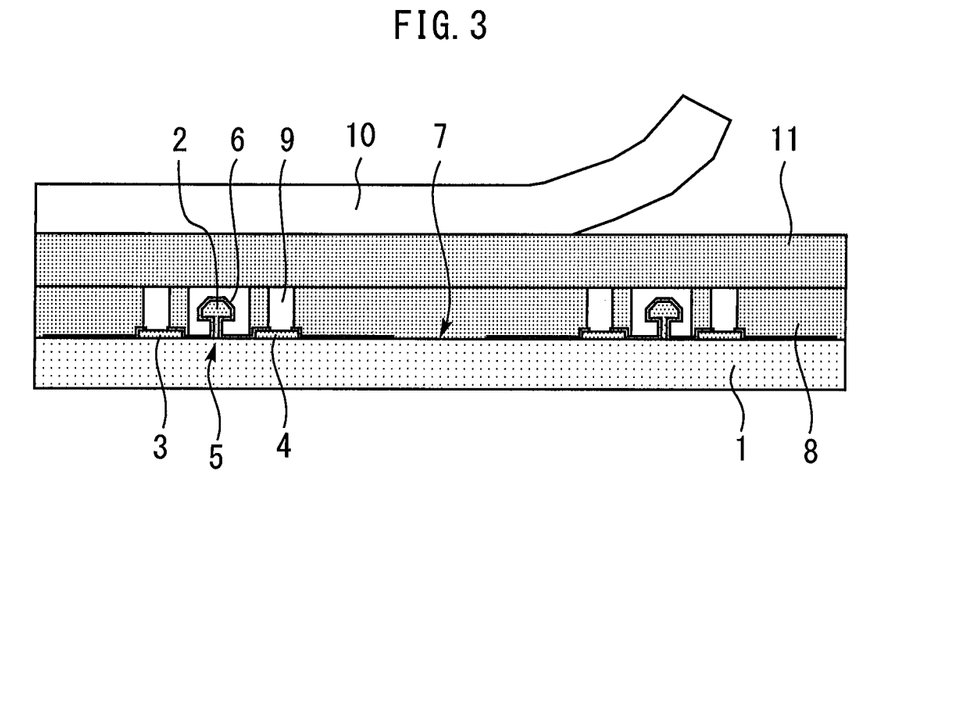
FIG. 3 is a cross-sectional view illustrating a method for manufacturing a semiconductor apparatus according to a first embodiment.
Figure 4:
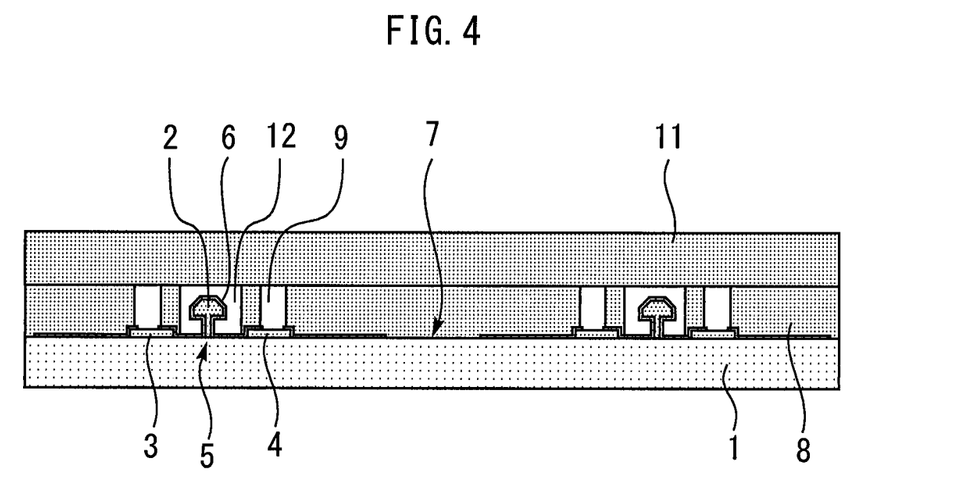
FIG. 4 is a cross-sectional view illustrating a method for manufacturing a semiconductor apparatus according to a first embodiment.

Next, as shown in FIG. 2, a photosensitive resin film 11 supported by a support film 10 is applied to the top surface of the photosensitive resin membrane 8 using a lamination method or STP method. The photosensitive resin film 11 covers above the gate electrode 2, the source electrode 3 and the drain electrode 4 while being separated from the gate electrode 2, the source electrode 3 and the drain electrode 4. Next, as shown in FIG. 3, the support film 10 is removed from the photosensitive resin film 11. In this way, as shown in FIG. 4, a hollow structure 12 is formed around the gate electrode 2.

Figure 5:
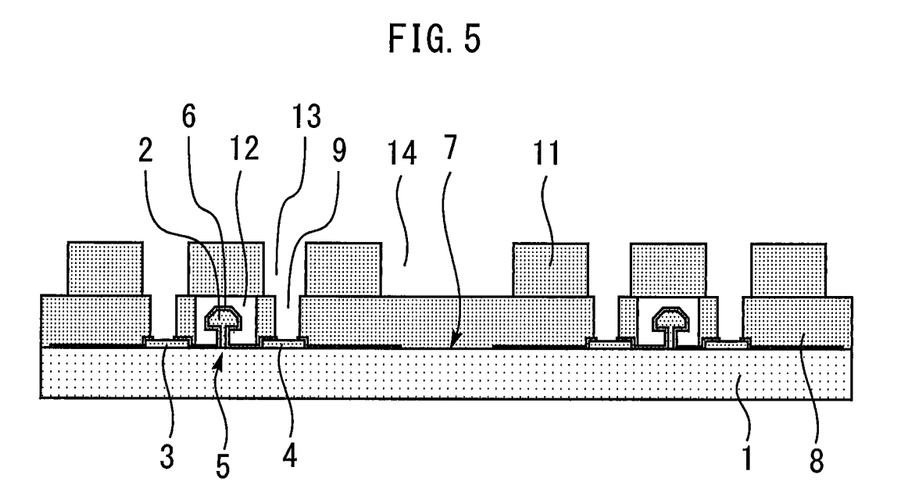
FIG. 5 is a cross-sectional view illustrating a method for manufacturing a semiconductor apparatus according to a first embodiment.

Next, as shown in FIG. 5, the photosensitive resin film 11 is patterned by exposure and development to form a second contact hole 13 connected to the first contact hole 9 and a first opening 14 above the dicing line 7 simultaneously. After that, thermosetting treatment is performed to cure the photosensitive resin film 11.

Figure 6:
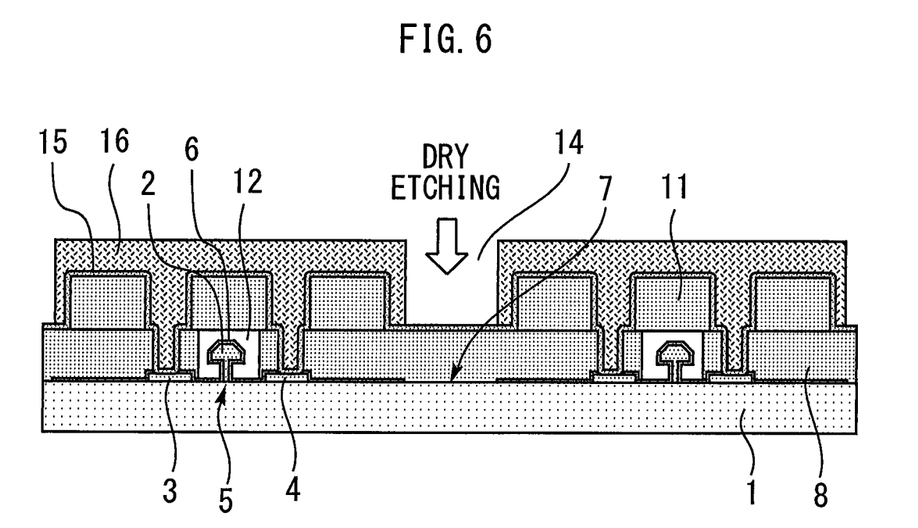
FIG. 6 is a cross-sectional view illustrating a method for manufacturing a semiconductor apparatus according to a first embodiment.
Figure 7:
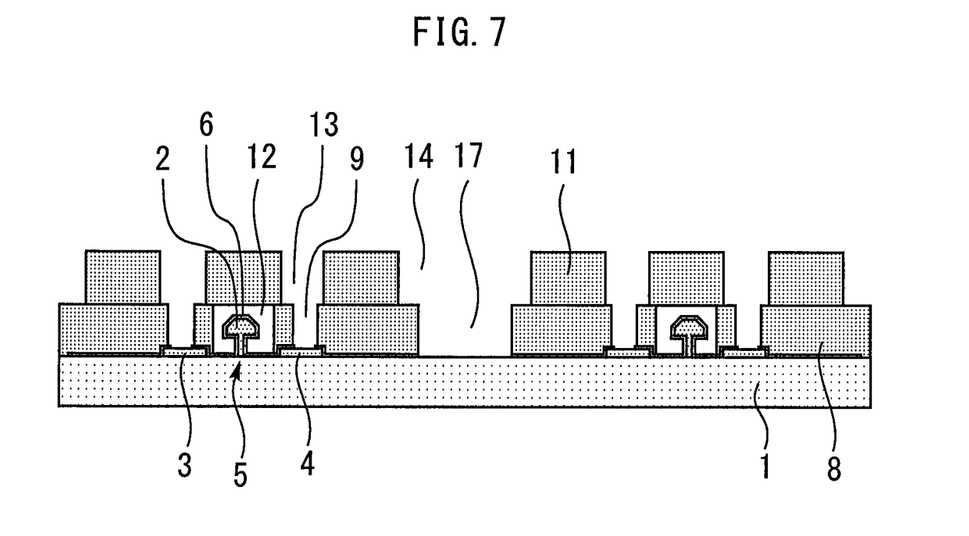
FIG. 7 is a cross-sectional view illustrating a method for manufacturing a semiconductor apparatus according to a first embodiment.

Next, as shown in FIG. 6, an insulating film 15 and a resist 16 are formed in order on the entire surface and the resist 16 is opened above the dicing line 7. Next, dry etching is performed using the resist 16 as a mask. Thus, as shown in FIG. 7, the insulating film 15 and the photosensitive resin membrane 8 on the dicing line 7 are removed to form a second opening 17. By removing the photosensitive resin film 11 above the dicing line 7 in advance, the thickness of the membrane to be removed by dry etching is reduced, and therefore dry etching becomes easier. After that, the insulating film 15 and the resist 16 used as the masks are removed.

Figure 8:
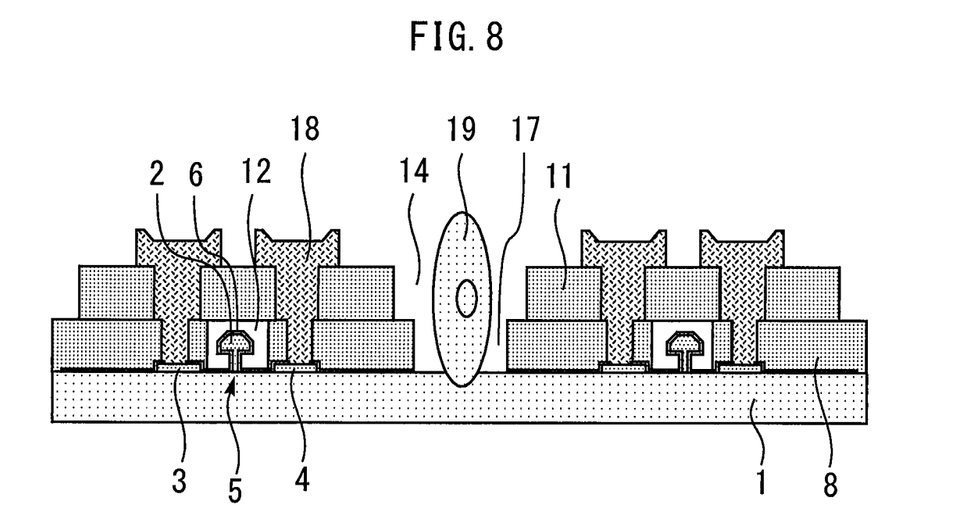
FIG. 8 is a cross-sectional view illustrating a method for manufacturing a semiconductor apparatus according to a first embodiment.
Figure 9:
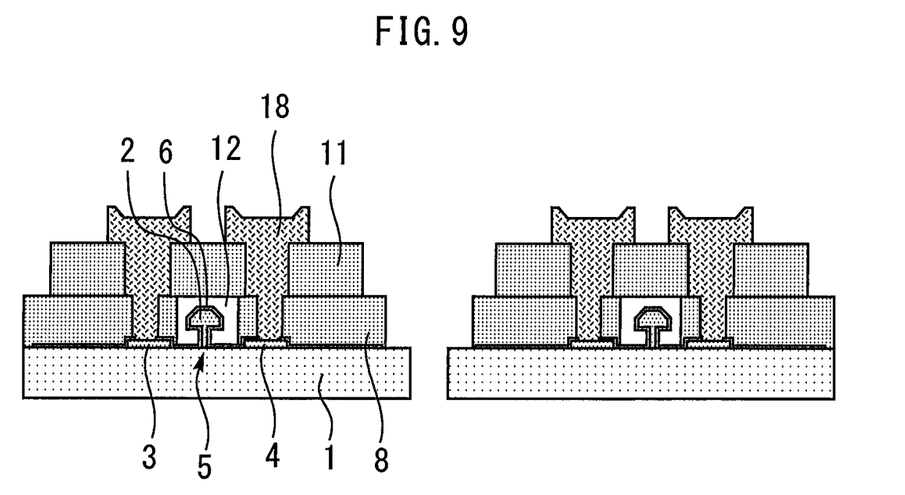
FIG. 9 is a cross-sectional view illustrating a method for manufacturing a semiconductor apparatus according to a first embodiment.

Next, as shown in FIG. 8, a wiring 18 connected to the source electrode 3 and the drain electrode 4 via the first and second contact holes 9 and 13 is formed by plating or a vapor deposition method. Next, the semiconductor substrate 1 is diced along the dicing line 7 using a dicing blade 19. As a result, as shown in FIG. 9, the semiconductor substrate 1 is separated into individual chips.

Figure 10:
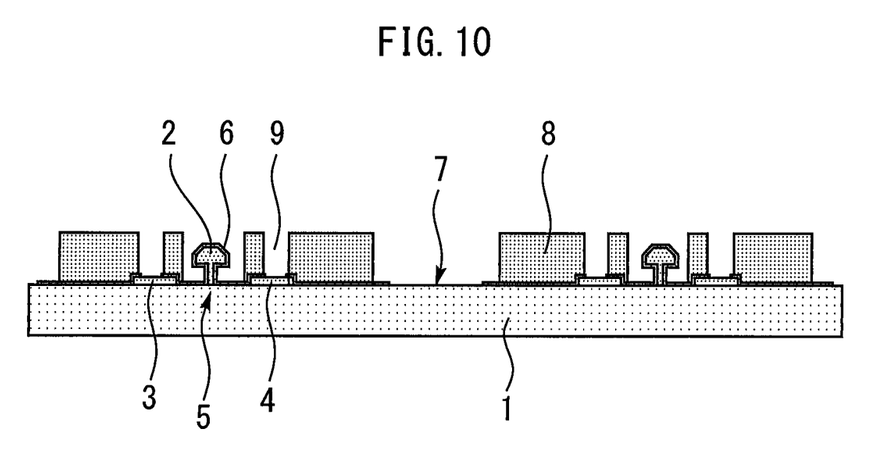
FIG. 10 is a cross-sectional view illustrating a method for manufacturing a semiconductor apparatus according to a comparative example.
Figure 11:
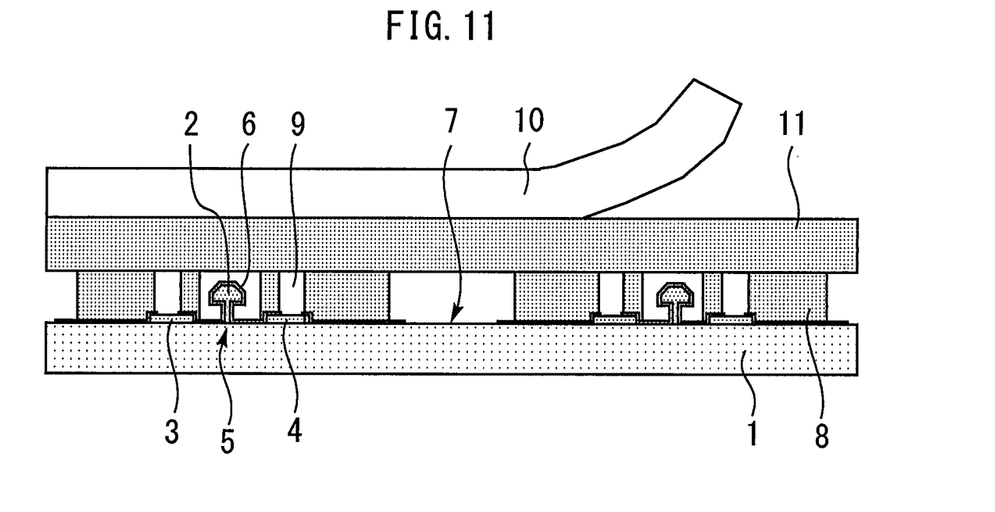
FIG. 11 is a cross-sectional view illustrating a method for manufacturing a semiconductor apparatus according to a comparative example.
Figure 12:
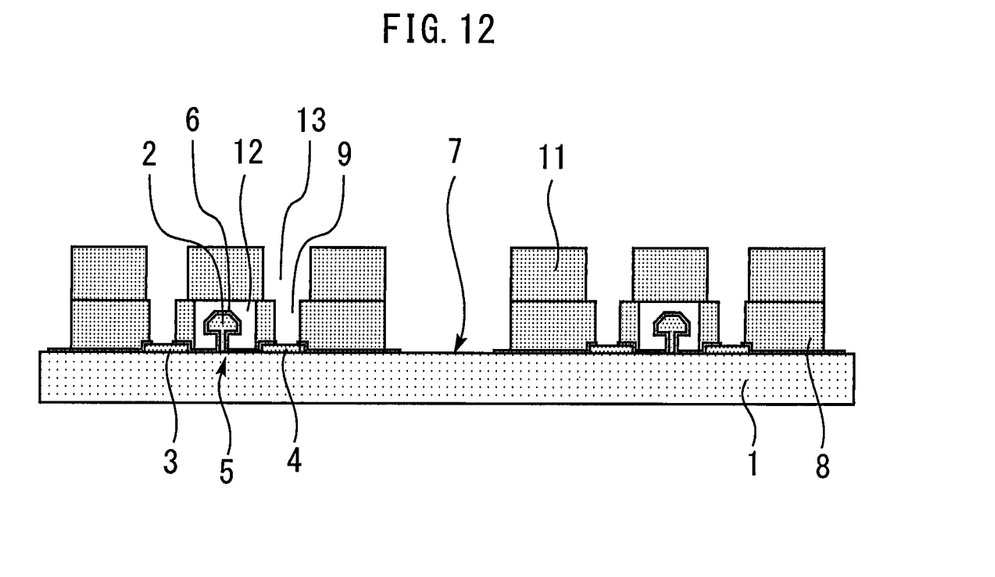
FIG. 12 is a cross-sectional view illustrating a method for manufacturing a semiconductor apparatus according to a comparative example.

Next, advantageous effects of the present embodiment will be described in comparison with comparative examples. FIG. 10 to FIG. 12 are cross-sectional views illustrating a method for manufacturing a semiconductor apparatus according to a comparative example. In the comparative example, as shown in FIG. 10, when the photosensitive resin membrane 8 is patterned, the photosensitive resin membrane 8 on the dicing line 7 is removed. Next, as shown in FIG. 11, the photosensitive resin film 11 is applied to the top surface of the photosensitive resin membrane 8. Next, as shown in FIG. 12, the photosensitive resin film 11 is exposed and developed.

In the comparative example, removal of the photosensitive resin membrane 8 on the dicing line 7 results in a reduction in the contact area between the photosensitive resin film 11 and the photosensitive resin membrane 8, and therefore the adhesive force is weakened. For this reason, when the support film 10 is removed from the photosensitive resin film 11, floating or peeling of the photosensitive resin film 11 may occur. The applied photosensitive resin film 11 may also be embedded in the hollow part. As a result, there is a problem that the product yield lowers.

In contrast, in the present embodiment, when the photosensitive resin membrane 8 is patterned, the photosensitive resin membrane 8 on the dicing line 7 is not removed. For this reason, the contact area between the photosensitive resin film 11 and the photosensitive resin membrane 8 increases, and therefore the adhesive force improves and it is possible to prevent floating and peeling of the photosensitive resin film 11. Since the photosensitive resin film 11 is firmly supported by the photosensitive resin membrane 8, embedding can also be prevented. As a result, the product yield can be improved.

When the photosensitive resin film 11 supported by the support film 10 is applied to the top surface of the photosensitive resin membrane 8, and the support film 10 is then removed from the photosensitive resin film 11, floating and peeling of the photosensitive resin film 11 may be likely to occur. In such a case, the improved adhesive force between the photosensitive resin film 11 and the photosensitive resin membrane 8 is particularly effective as in the present embodiment.

The gate electrode 2 is a Y-shaped or T-shaped gate electrode including overhangs and the hollow structure 12 is also formed under the overhangs of the gate electrode 2. In this way, the parasitic capacitance decreases and the gain of high frequency characteristics improves.

After forming the first opening 14 and before dicing the semiconductor substrate 1, the photosensitive resin membrane 8 on the dicing line 7 is removed to form a second opening 17. This facilitates the dicing.

An end part of the first opening 14 of the photosensitive resin film 11 is located closer to the semiconductor device 5 side than an end part of the second opening 17 of the photosensitive resin membrane 8. This can prevent the dicing blade from contacting the end part of the first opening 14 of the photosensitive resin film 11 when forming the dicing line. This improves the yield of the semiconductor apparatus.

Second Embodiment

Figure 13:
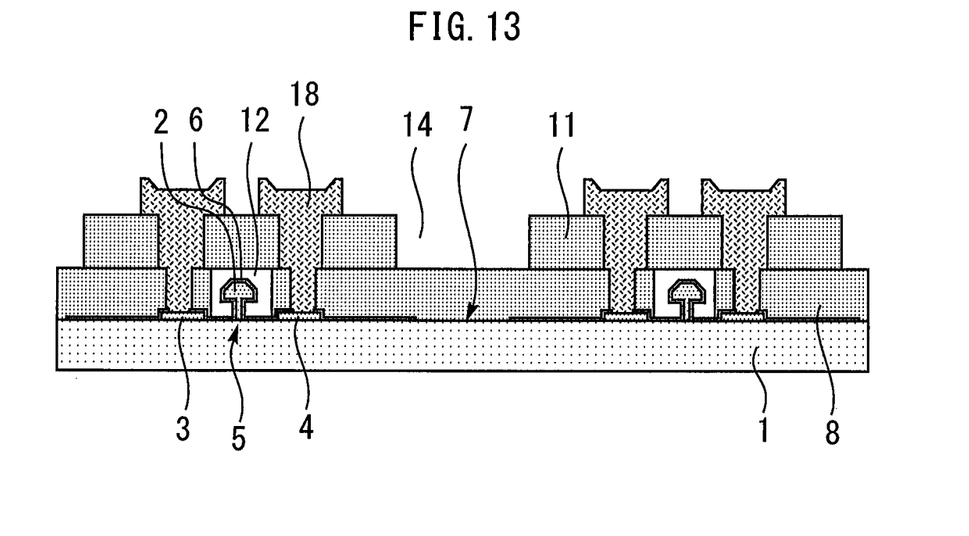
FIG. 13 is a cross-sectional view illustrating a method for manufacturing a semiconductor apparatus according to a second embodiment.
Figure 14:
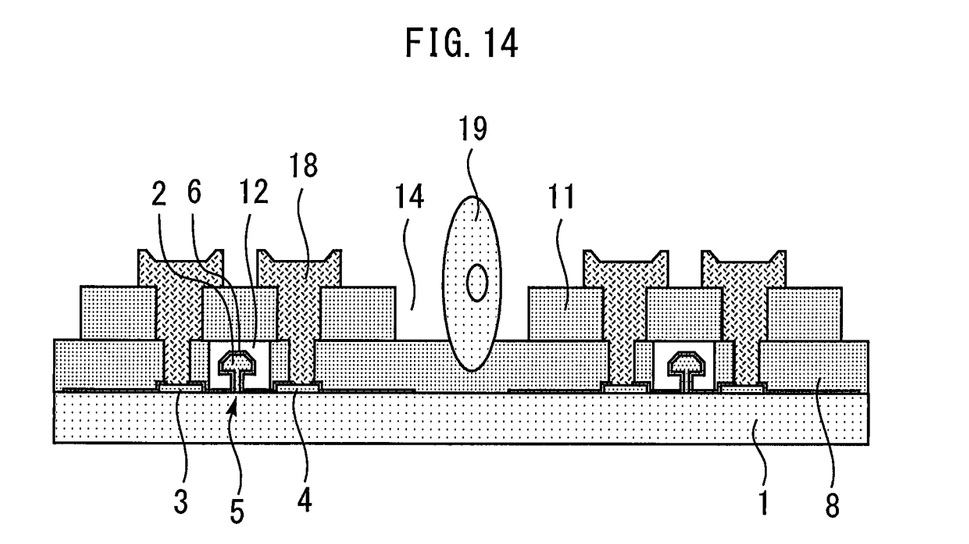
FIG. 14 is a cross-sectional view illustrating a method for manufacturing a semiconductor apparatus according to a second embodiment.

FIG. 13 and FIG. 14 are cross-sectional views illustrating a method for manufacturing a semiconductor apparatus according to a second embodiment. The steps up to the step in FIG. 5 are similar to the steps in the first embodiment. In the present embodiment, the wiring 18 connected to the source electrode 3 and the drain electrode 4 via the first and second contact holes 9 and 13 is formed without processing the photosensitive resin membrane 8 on the dicing line 7 by dry etching, as shown in FIG. 13. Next, as shown in FIG. 14, the photosensitive resin membrane 8 on the dicing line 7 is diced together with the semiconductor substrate 1. It is thereby possible to reduce the number of processes compared to the first embodiment. The other components and effects are similar to those in the first embodiment.

Third Embodiment

Figure 15:
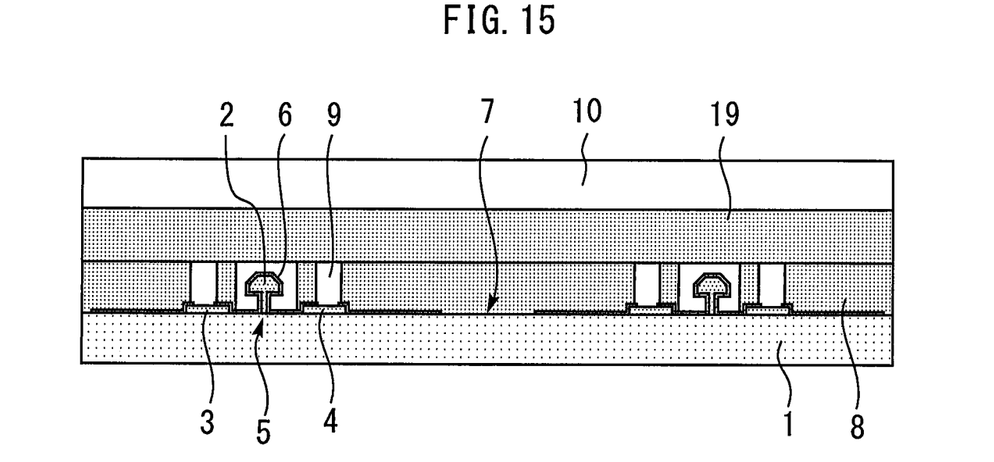
FIG. 15 is a cross-sectional view illustrating a method for manufacturing a semiconductor apparatus according to a third embodiment.
Figure 16:
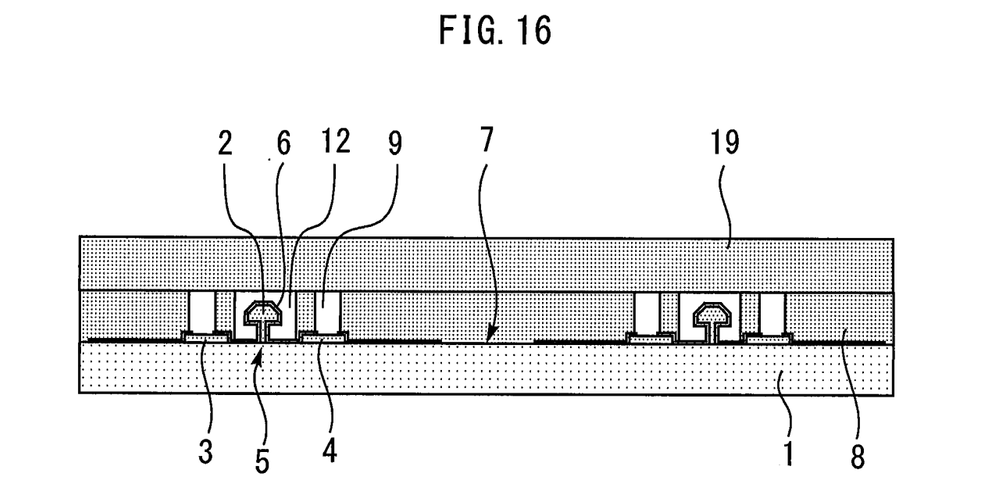
FIG. 16 is a cross-sectional view illustrating a method for manufacturing a semiconductor apparatus according to a third embodiment.
Figure 17:
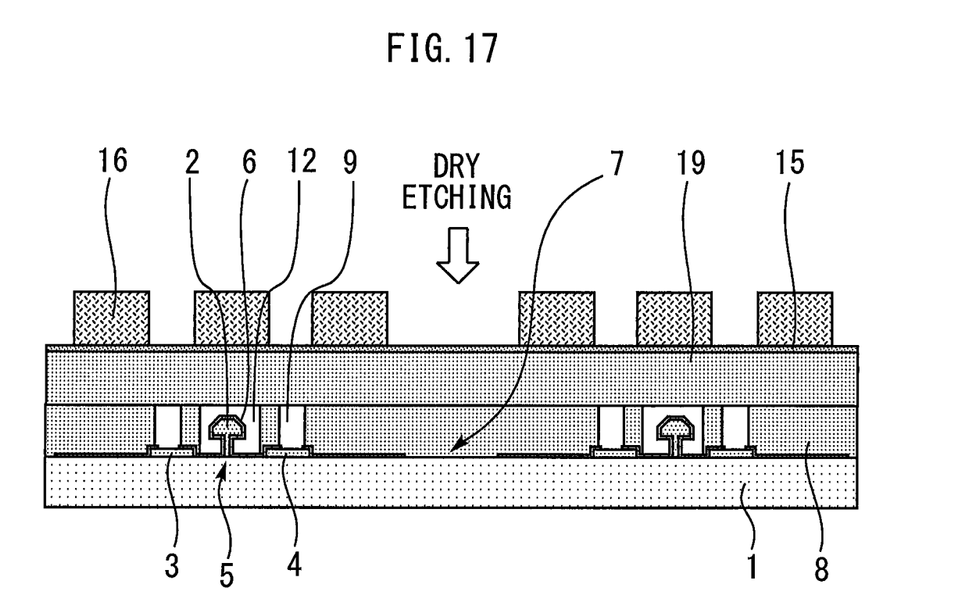
FIG. 17 is a cross-sectional view illustrating a method for manufacturing a semiconductor apparatus according to a third embodiment.
Figure 18:
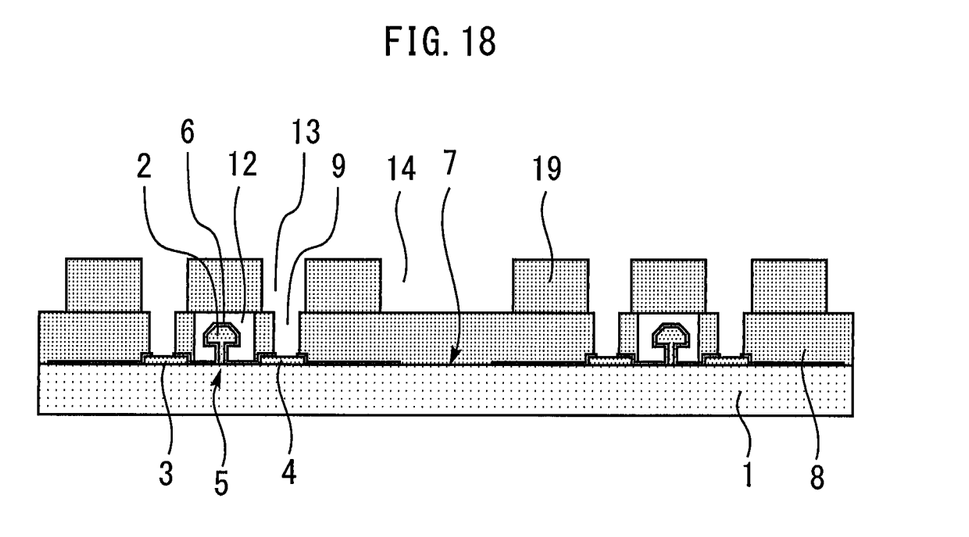
FIG. 18 is a cross-sectional view illustrating a method for manufacturing a semiconductor apparatus according to a third embodiment.

FIG. 15 to FIG. 18 are cross-sectional views illustrating a method for manufacturing a semiconductor apparatus according to a third embodiment. In the present embodiment, the photosensitive resin film 11 according to the first and second embodiments is replaced by a non-photosensitive resin film 19. The steps up to the step in FIG. 5 are similar to the steps in the first embodiment. Next, as shown in FIG. 15, the non-photosensitive resin film 19 supported by the support film 10 is applied to the top surface of the photosensitive resin membrane 8 using a lamination method or a STP method. The non-photosensitive resin film 19 covers above the gate electrode 2, the source electrode 3 and the drain electrode 4 while being separated from the gate electrode 2, the source electrode 3 and the drain electrode 4. Next, when the support film 10 is removed from the non-photosensitive resin film 19, the hollow structure 12 is formed around the gate electrode 2 as shown in FIG. 16. Next, as shown in FIG. 17, the insulating film 15 and the resist 16 are formed in order over the entire surface and the resist 16 is patterned using photolithography or the like. By performing dry etching using the resist 16 as a mask, the second contact hole 13 and the first opening 14 are opened as shown in FIG. 18. After that, a device structure is manufactured by executing steps of either the first embodiment or the second embodiment. The other components and effects are similar to those of the first embodiment.

REFERENCE SIGNS LIST

1 semiconductor substrate; 2 gate electrode (first electrode); 3 source electrode (second electrode), 4 drain electrode (second electrode); 5 semiconductor device; 7 dicing line; 8 photosensitive resin membrane (resin membrane); 9 first contact hole; 11 photosensitive resin film (resin film); 12 hollow structure; 13 second contact hole; 14 first opening; 17 second opening; 18 wiring

The invention claimed is:

1. A method for manufacturing a semiconductor apparatus comprising:
    forming a semiconductor device including first and second electrodes on a main surface of a semiconductor substrate;
    forming a resin membrane covering the semiconductor device and a dicing line of the semiconductor substrate on the main surface of the semiconductor substrate;
    removing the resin membrane around the first electrode and removing the resin membrane on the second electrode to form a first contact hole without removing the resin membrane on the dicing line;
    applying a resin film covering above the first and second electrodes and separated from the first and second electrodes to a top surface of the resin membrane to form a hollow structure around the first electrode;
    patterning the resin film to form a second contact hole connected to the first contact hole and a first opening above the dicing line simultaneously;
    forming a wiring connected to the second electrode via the first and second contact holes; and
    after forming the first opening, dicing the semiconductor substrate along the dicing line.

2. The method for manufacturing a semiconductor apparatus according to claim 1, wherein after the resin film supported by a support film is applied to a top surface of the resin membrane, the support film is removed from the resin film.

3. The method for manufacturing a semiconductor apparatus according to claim 2, wherein the first electrode is a Y-shaped or T-shaped gate electrode including overhangs and the hollow structure is also formed under the overhangs of the gate electrode.

4. The method for manufacturing a semiconductor apparatus according to claim 2, further comprising, after forming the first opening and before dicing the semiconductor substrate, the resin membrane on the dicing line is removed to form a second opening.

5. The method for manufacturing a semiconductor apparatus according to claim 4, wherein an end part of the first opening is located closer to the semiconductor device side than an end part of the second opening.

6. The method for manufacturing a semiconductor apparatus according to claim 2, wherein the resin membrane on the dicing line is diced together with the semiconductor substrate.

7. The method for manufacturing a semiconductor apparatus according to claim 1, wherein the first electrode is a Y-shaped or T-shaped gate electrode including overhangs and the hollow structure is also formed under the overhangs of the gate electrode.

8. The method for manufacturing a semiconductor apparatus according to claim 7, further comprising, after forming the first opening and before dicing the semiconductor substrate, the resin membrane on the dicing line is removed to form a second opening.

9. The method for manufacturing a semiconductor apparatus according to claim 7, wherein the resin membrane on the dicing line is diced together with the semiconductor substrate.

10. The method for manufacturing a semiconductor apparatus according to claim 8, wherein an end part of the first opening is located closer to the semiconductor device side than an end part of the second opening.

11. The method for manufacturing a semiconductor apparatus according to claim 1, further comprising, after forming the first opening and before dicing the semiconductor substrate, the resin membrane on the dicing line is removed to form a second opening.

12. The method for manufacturing a semiconductor apparatus according to claim 11, wherein an end part of the first opening is located closer to the semiconductor device side than an end part of the second opening.

13. The method for manufacturing a semiconductor apparatus according to claim 1, wherein the resin membrane on the dicing line is diced together with the semiconductor substrate.

* * * * *